US011545471B2

(12) United States Patent
Pang et al.

(10) Patent No.: US 11,545,471 B2
(45) Date of Patent: Jan. 3, 2023

(54) RGB LED PACKAGE WITH BSY EMITTER

(71) Applicant: CreeLED, Inc., Durham, NC (US)

(72) Inventors: Charles Chak Hau Pang, Fanling (HK); Victor Yue Kwong Lau, Laguna (HK); Tiancai Su, Huizhou (CN)

(73) Assignee: CreeLED, Inc., Durham, NC (US)

( * ) Notice: Subject to any disclaimer, the term of this patent is extended or adjusted under 35 U.S.C. 154(b) by 51 days.

(21) Appl. No.: 16/624,266

(22) PCT Filed: Jul. 7, 2017

(86) PCT No.: PCT/CN2017/092289
§ 371 (c)(1),
(2) Date: Dec. 18, 2019

(87) PCT Pub. No.: WO2019/006763
PCT Pub. Date: Jan. 10, 2019

(65) Prior Publication Data
US 2020/0118983 A1 Apr. 16, 2020

(51) Int. Cl.
*H01L 33/64* (2010.01)
*H01L 25/075* (2006.01)
(Continued)

(52) U.S. Cl.
CPC .......... *H01L 25/0753* (2013.01); *H01L 25/13* (2013.01); *H01L 33/486* (2013.01);
(Continued)

(58) Field of Classification Search
CPC ............... H01L 25/0753; H01L 33/486; H01L 33/50–508; H01L 33/60; H01L 33/64;
(Continued)

(56) References Cited

U.S. PATENT DOCUMENTS 9,831,393 B2  11/2017 Chan et al.
2009/0001393 A1* 1/2009 Seo ............... H01L 25/0753
257/89
(Continued)

FOREIGN PATENT DOCUMENTS

CN  202111155 U  1/2012
CN  202977516 U  6/2013
(Continued)

OTHER PUBLICATIONS

International Preliminary Report on Patentability for International Patent Application No. PCT/CN2017/092289, dated Jan. 16, 2020, 8 pages.
(Continued)

*Primary Examiner* — Phat X Cao
*Assistant Examiner* — William Henry Anderson
(74) *Attorney, Agent, or Firm* — Withrow & Terranova, P.L.L.C.

(57) ABSTRACT

LED packages are disclosed capable of emitting a range of colors including white light, while still emitting that can have a high color rendering index (CRI). The LED packages can have a simplified reflective cup arrangement and improved lead frame design. The LED packages according to the present invention comprise one or more LED WITH PHOSPHORs for high CRI lighting applications, along with multiple narrowband emitters (e.g. RGB LEDs), but do not have a dam or partition to segregate the LED WITH PHOSPHOR from the multiple emitters. This results in a LED package that is less complex and easier to manufacture, while still providing the desired flexibility in LED package emissions.

20 Claims, 8 Drawing Sheets

(51) Int. Cl.
  *H01L 25/13* (2006.01)
  *H01L 33/48* (2010.01)
  *H01L 33/50* (2010.01)
  *H01L 33/60* (2010.01)
  *H01L 33/62* (2010.01)

(52) U.S. Cl.
  CPC .............. *H01L 33/50* (2013.01); *H01L 33/60* (2013.01); *H01L 33/62* (2013.01); *H01L 33/642* (2013.01); *H01L 33/647* (2013.01)

(58) Field of Classification Search
  CPC ... H01L 33/642; H01L 33/644; H01L 33/647; H01L 23/3672; H01L 23/49568; H01L 33/36; H01L 33/38
  See application file for complete search history.

(56) References Cited

U.S. PATENT DOCUMENTS

| | | | |
|---|---|---|---|
| 2011/0037083 A1 | 2/2011 | Chan et al. | |
| 2012/0025227 A1* | 2/2012 | Chan | H01L 33/62 257/89 |
| 2013/0037842 A1* | 2/2013 | Yamada | H01L 33/60 257/E33.072 |
| 2014/0167078 A1* | 6/2014 | Jang | H01L 29/866 257/88 |
| 2014/0291715 A1* | 10/2014 | Reiherzer | H01L 33/60 257/98 |
| 2015/0179903 A1* | 6/2015 | Pun | H01L 33/54 257/88 |
| 2016/0155918 A1* | 6/2016 | Toyama | H01L 25/0753 257/99 |
| 2017/0155022 A1* | 6/2017 | Tomonari | H01L 33/52 |

FOREIGN PATENT DOCUMENTS

| | | |
|---|---|---|
| CN | 203179879 U | 9/2013 |
| CN | 103456726 A | 12/2013 |
| WO | 2011008627 A2 | 1/2011 |

OTHER PUBLICATIONS

International Search Report and Written Opinion for International Patent Application No. PCT/CN2017/092289, dated Apr. 4, 2018, 11 pages.

* cited by examiner

RGB LED PACKAGE WITH BSY EMITTER

CROSS REFERENCE TO RELATED APPLICATIONS

This national phase application claims priority to International Application No. PCT/CN2017/092289, having the same title and filed on Jul. 7, 2017.

BACKGROUND OF THE INVENTION

Field of the Invention

The present invention is directed to light emitting diode (LED) packages and in particular to LED packages having LEDs controllable to emit combined light at the desired color of light, and having a LED with phosphor to emit white light with a high color rendering index (CRI).

Description of the Related Art

LEDs have become a popular light source for most lighting applications because of their reliability and efficiency. In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wire bond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that reaches the surface of the lens 36 is maximized to maximize the amount of light that emits from the lens 36 on the first pass. This can result in relatively large devices where the distance from the LED to the edge of the lens is maximized, and the edge of the submount can extend out beyond the edge of the encapsulant. Further, these devices generally produce a Lambertian emission pattern that is not always ideal for wide emission area applications. In some conventional packages the emission profile can be approximately 120 degrees full width at half maximum (FWHM).

LED packages have also been developed that have multiple LEDs, each of which can be individually controllable to emit light of the desired intensity. Electrical signals applied to the LED package causes it to emit at a color that is a combination of light from the multiple LEDs. By controlling the emission of each LED, the package can emit different color combinations over a relatively wide spectrum. Some of these LED packages can have red, green and blue emitting LEDs that can emit a combination of many different wavelengths (i.e. colors) of light, including white light.

A color rendering index (CRI) is a quantitative measure of the ability of a light source to reveal the colors of various objects faithfully in comparison with an ideal or natural light source. One problem with LED packages having a plurality of LEDs that emit different colors of light is that the light can exhibit a relatively poor CRI. For example, the red, green and blue LED in a package can combine to emit white light, but the light can exhibit peak emissions at the red, green and blue emission wavelengths. To provide higher CRI the emission spectrum should be broad, and the peak emissions can result in overall white emission spectrum with relatively poor CRI.

Single LED white solid state emitters have been developed that can comprise an LED surrounded by a phosphor. Examples of these emitters can comprise a blue emitting LED surrounded by one or more phosphors such as yellow, red, green, orange, cyan or combinations thereof. Blue light from the LED can be absorbed by the phosphor and be remitted as different color of light (e.g. yellow), and a portion of the blue light can pass through the phosphor without being converted. The overall emission can comprise a white light combination of blue and phosphor light and the overall emission has a wider spectrum exhibiting a higher CRI compared to RGB white light. This type of device is referred to as an LED with phosphor.

To address the problem of relatively poor CRI from RGB emitters packages emitting white light, LED packages have been developed that include both an RGB combination of LEDs and a LED with phosphor. FIG. 4 shows one such LED package 40 having narrowband red, green and blue LEDs 41, 42, 43 mounted in the package's reflective cup 44. A blue LED 47 is also included in the reflective cup 44 in a portion remote from the RGB LEDs 41, 42, 43. To provide the complimentary higher CRI white emission from the LED with phosphor, a dam or partition 46 is included in the reflective cup to divide the blue LED from the RGB LEDs 41, 42 and 43. A clear encapsulant, or clear encapsulant (with scattering particles) can be included in the portion of the reflective cup over the narrowband RGB LEDs. In the portion of the reflective cup with the blue LED an encapsulant with a phosphor 45 can be included over the blue LED to convert a portion of the blue light as described above. The dam 46 prevents the phosphor encapsulant from migrating over the RGB LEDs. The blue LED covered by the phosphor can provide white light with a higher CRI compared to the RGB white light.

SUMMARY OF THE INVENTION

The present invention is generally directed to emitter or LED packages having a plurality of LEDs and some embodiments have a plurality of narrowband LEDs whose emissions can be combined to produce different colors of light. The packages can also include a LED with phosphor to provide a white light having a higher CRI than white emission from the narrowband LEDs. In some LED packages according to the present invention the LED with phosphor can comprise a blue emitting LED coated with a phosphor. The reflective cup is provided without a dam or partition, allowing for the narrowband LEDs and the LED with phosphor to be in the same reflective cup and covered by the same encapsulant. The LED packages can also comprise improved lead frames that provide robust adhesion between the lead frame and housing, while at the same time providing increased surface area for reliable contacting and improved package heat management.

One embodiment of an LED package according to the present invention comprises a housing having a single reflective cup and a lead frame integral to the housing. A portion of the lead frame is exposed in the reflective cup. The lead frame comprising leads that run along the bottom surface of the housing from opposing sides of the housing, with at least some of the leads from opposing sides overlapping. The package also including a plurality of LEDs mounted to the lead frame in the reflective cup, with the lead frame arranged to allow for individual control of the LEDs.

Another embodiment of an LED package according to the present invention comprises a housing having an undivided reflective cup, with a plurality of narrowband LEDs and a LED with phosphor mounted in the reflective cup. A lead frame is included that is integral to the housing and arranged to allow for individual control of each of the LEDs, wherein the lead frame extends on and covers more than 50 percent of the bottom surface of the housing.

Still another of an LED package comprises a housing having a single undivided reflective cup. A lead frame is included integral to the housing, with a portion of the lead frame exposed in the reflective cup. A plurality of narrowband LEDs and a broadband LED with phosphor are mounted to the lead frame in a linear or in square pattern, the lead frame arranged to allow for individual control of the LEDs.

The present invention is also directed to LED displays that can utilize a plurality of the LED packages described herein to generate and image or message.

These and other aspects and advantages of the invention will become apparent from the following detailed description and the accompanying drawings which illustrate by way of example the features of the invention.

DETAILED DESCRIPTION OF THE INVENTION

Figure 1:
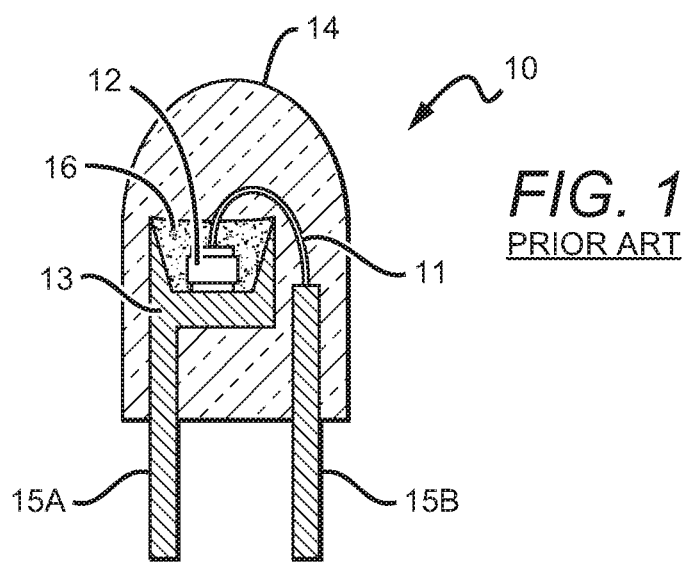
FIG. 1 shows a sectional view of a prior art LED package.
Figure 2:
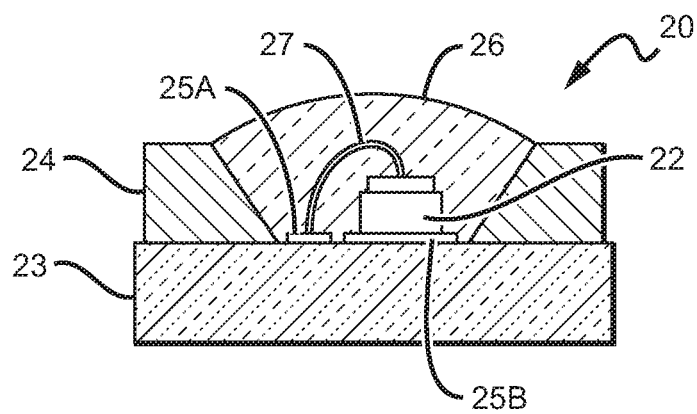
FIG. 2 shows a sectional view of another prior art LED package.
Figure 3:
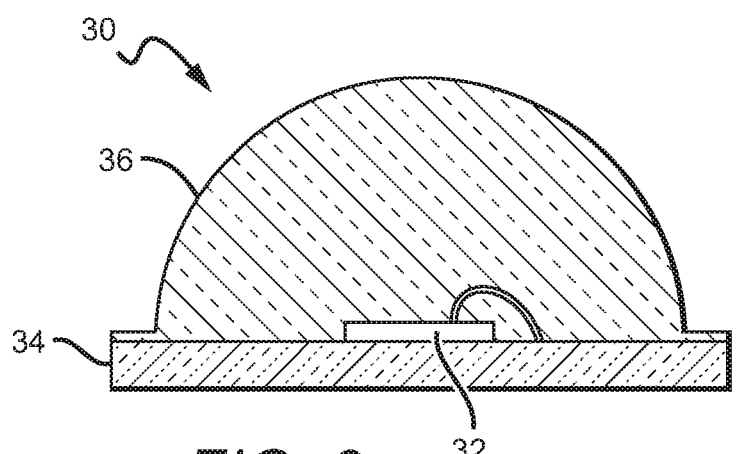
FIG. 3 shows a sectional view of another prior art LED package.
Figure 4:
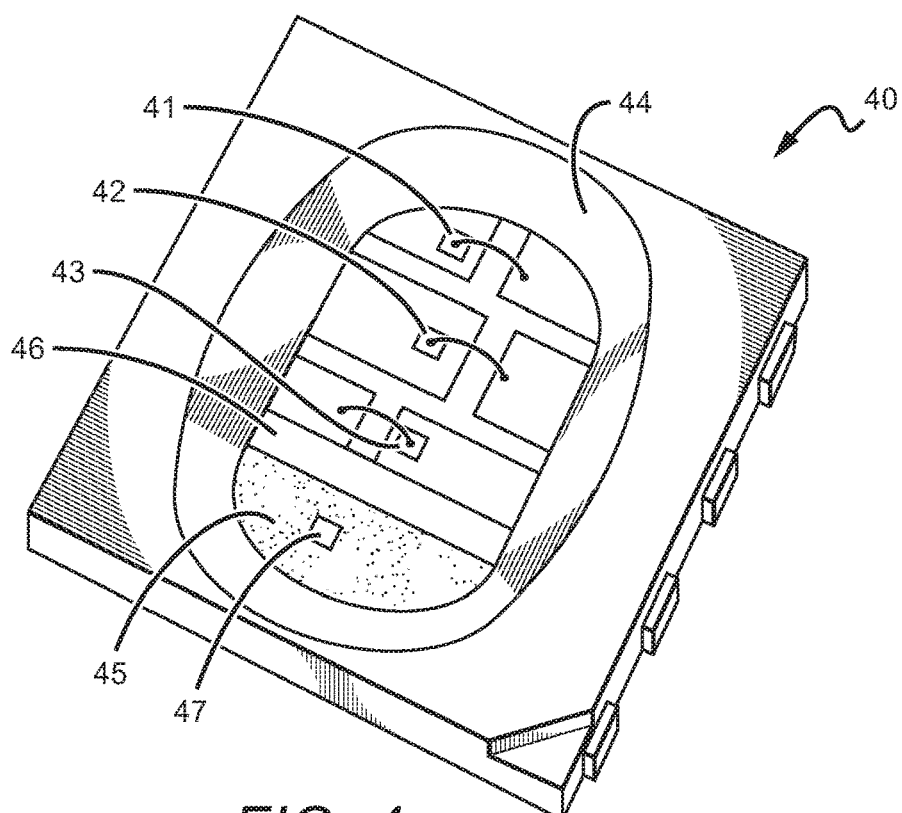
FIG. 4 is perspective view of still another prior art LED package.
Figure 5:
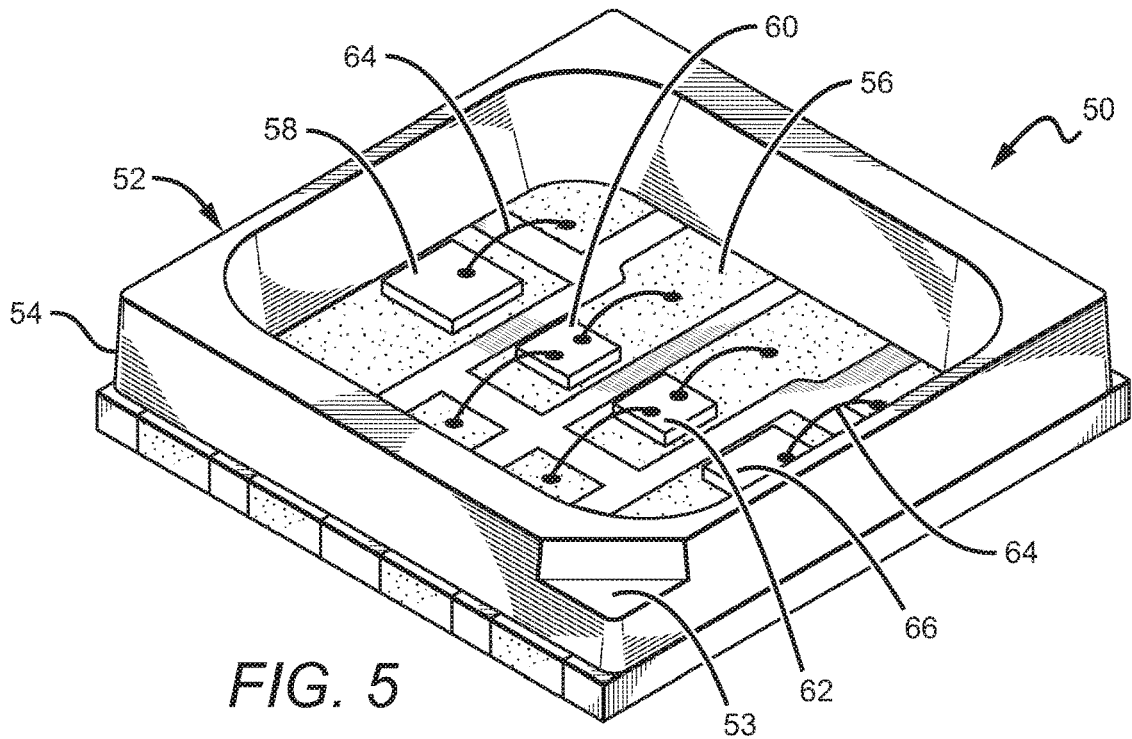
FIG. 5 is perspective view of one embodiment of an LED package according to the present invention.
Figure 6:
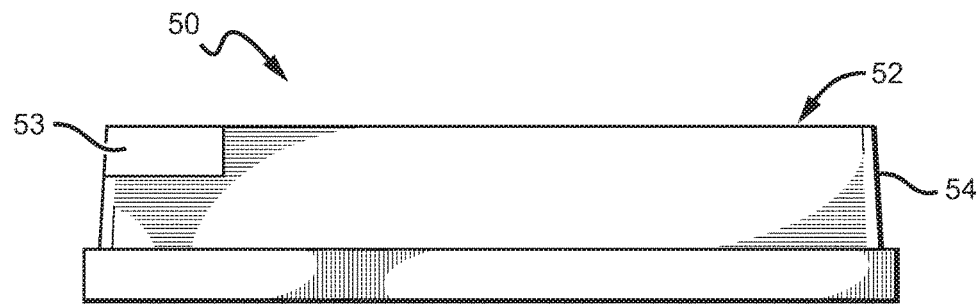
FIG. 6 is a right elevation view of an LED package according to one embodiment of the present invention.
Figure 7:
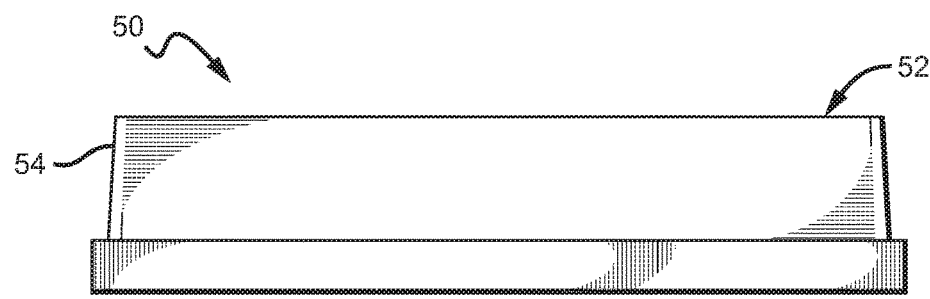
FIG. 7 is a left elevation view of an LED package according to one embodiment of the present invention.
Figure 8:
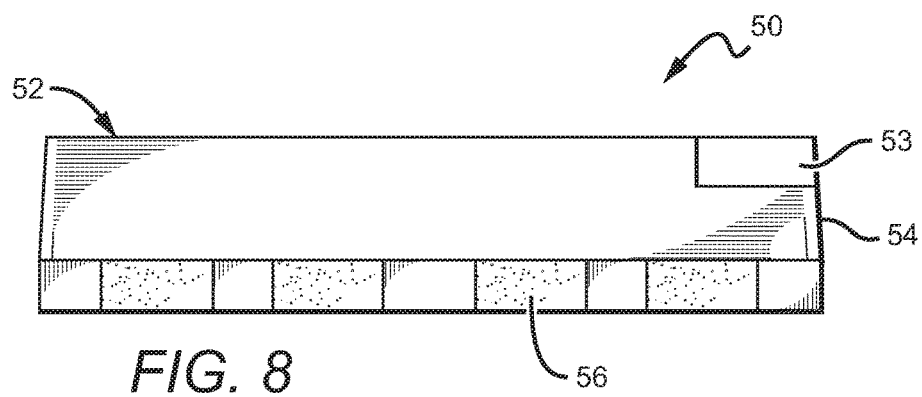
FIG. 8 is a front elevation view of an LED package according to an embodiment of the present invention.
Figure 9:
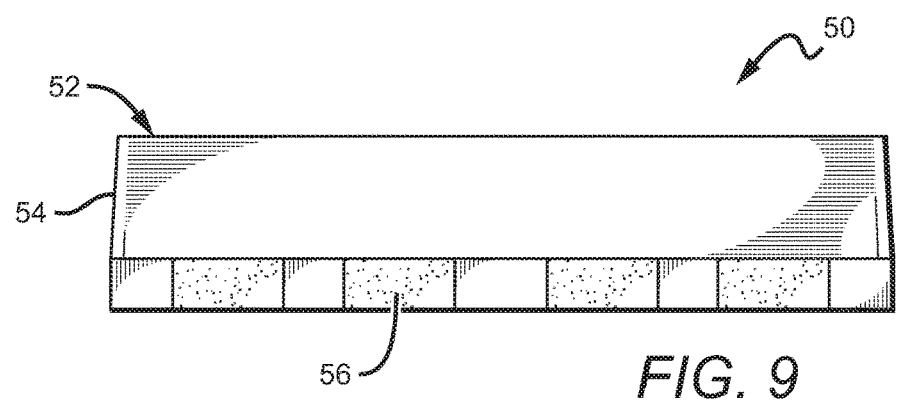
FIG. 9 is a rear elevation view of an LED package according to one embodiment of the present invention.
Figure 10:
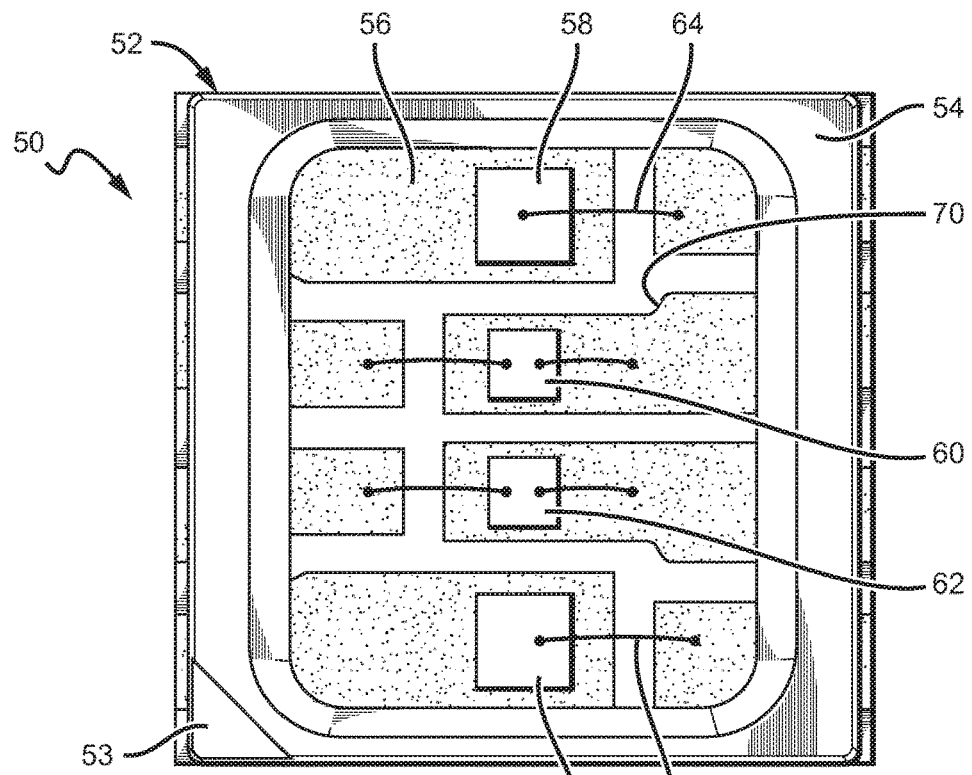
FIG. 10 is a top plan view of an LED package according to one embodiment of the present invention.

The present invention is directed to different embodiments of LED packages having a simplified reflective cup arrangement and improved lead frame design. The LED packages according to the present invention comprise one or more LEDs with phosphor for high CRI lighting applications, along with multiple narrowband emitters (e.g. RGB LEDs). The packages, however, do not have a reflective cup with a dam or partition to segregate the LED with phosphor from the multiple emitters. This results in a LED package that is less complex and easier to manufacture, while still providing the desired flexibility in LED package emissions.

In some embodiments, the LED packages can utilize as the LED with phosphor, a blue emitting LED that is coated by a phosphor layer. By using a coated chip, the LED packages do not need to include a yellow phosphor in the encapsulant, as is done with prior LED packages. Accordingly, there is no need for a dam or partition to separate the phosphor encapsulant from the remaining encapsulant. All the LEDs in the package can be covered by the same encapsulant. The reflective cup design and manufacturing is less complicated and less costly, and allows for the use of single encapsulant, which further reduces complications and cost. This improved design can also allow for the LED with phosphor to be placed in closer proximity to the RGB LEDs, which can allow for smaller overall LED packages and can allow for all the LED to more closely approximate a point source.

The LED packages according to the present invention can also comprise improved lead frame structures to enhance the heat management and reliability of the LED packages. The lead frames include extended portions along the bottom surface of the LED packages that provide larger surfaces for making electrical connection to the LED packages when mounting for use. This larger area increases the likelihood of making good contact to the LED package when mounting and can result in more reliable contacting during use. The larger lead frame area can also provide for improved heat management of the LED package. Heat from the LEDs spreads into the lead frame during operation, with the heat spreading to the lead frame portion at the bottom of the package. The increased area of the lead frame provides greater surface area for the heat to dissipate, resulting in the heat more efficiently dissipating from the LED package. The portions of the lead frame on the bottom of the LED package can also be relatively thin compared to the thickness of the LED package, which can bring the LED package closer to the mounting surface when mounting the LED package for use. This can also result in a more stable and reliable mounting of the LED package.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, such as rectangular, and the solder pads and attach pads can be arranged in many different ways. In the embodiments described herein and in other embodiments, the emission intensity of the different types of LED chips can be controlled to vary the overall LED package emission.

The present invention can be described herein with reference to conversion materials such as phosphors, phosphor layers and related terms. The use of these terms should not be construed as limiting. It is understood that the use of the term remote phosphors, phosphor or phosphor layers is meant to encompass and be equally applicable to all wavelength conversion materials.

The embodiments below are described with reference to an LED or LEDs, but it is understood that this is meant to encompass LED chips, and these terms can be used interchangeably. These components can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package.

It is also understood that when a feature or element such as a layer, region, or housing may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 5-11 show one embodiment of an LED package 50 according to the present invention that comprises a plurality of narrowband emitters used in combination with an LED with phosphor. In the embodiment shown and as described below, the narrowband emitters can comprise red, green and blue LEDs, but it is understood that other combinations of LEDs can be used as narrowband emitters. In some embodiments the narrowband emitters can comprise LEDs where at least some emit a color different from red, green or blue. In some embodiments, these narrowband emitters can comprise uncoated LEDs and in particular LED not coated by a conversion material such as a phosphor. In other embodiments, the narrowband emitters can be coated with conversion material with a narrowband emission, such as a narrowband phosphor or a quantum dots. The LED with phosphor produces a broadband emission pattern and can comprise a broadband LED where the primary radiation is downconverted by a lumiphoric material or a plurality of lumiphoric materials such as phosphors, quantum dots, etc., and is mixed with the LED emission to generate white light or other mixtures of colors. In other embodiments, the LED with phosphor can comprise a narrowband emission LED where the broad emission is provided by the lumiphoric material or materials.

The LED package 50 comprises a housing 52 having a generally square footprint and a reflective cup 54. It is understood that different embodiments of LED packages according to the present invention can have different shapes and sizes, including footprints with different shapes and sizes. The housing 52 can be fabricated of material that is electrically insulating and in some embodiments can also be thermally conductive. Such materials are known in the art and may include, without limitation, thermoplastic polycondensates (e.g., a polyphthalamide (PPA)), certain ceramics, resins, epoxies, and glass. The housing also be formed of dark or black material(s) or coated with a black material to improve contrast in image generation LED packages, such as with packages employed in video displays.

The reflective cup 54 is generally square shaped with curved corners, and in the LED package 50 the reflective cup is provided without a dam or partition that is necessary in conventional LED packages. The reflective cup 54 also has angled side walls to reflect light emitted sideways from the LED chips to contribute to useful emission from the package 50. The reflective cup opening covers most of the top of package 50, and in the embodiment shown the reflective cup opening covers 60% or more of the top surface of the LED package. It is understood, however, that in other embodiments it can cover different percentages of the top surface. For example, alternative embodiments the reflective cup opening can cover 70%, 80% or more of the top surface, while other embodiments can cover 50%, 40% or less. The generally square shape of the reflective cup and the close proximity of the LED chips allows for desired far field emission pattern as described below. It is understood that in other embodiments, the reflective cup can have different shapes including but not limited to oval, circular or rectangular. The reflective cup can also have angled sidewalls and the emission pattern of the package can be enhanced by forming the sidewall to the desired angle. The reflective cup sidewall can have an angle of up to approximately 90 degrees to the bottom surface of the reflective cup. In other embodiments, the sidewall can have an angle of approximately 50 degrees. In still other possible embodiments, a sidewall can have an angle in the range of between 50.0-90.0 degrees or less than 50.0 degrees may provide for desired emission patterns.

The LED package 50 can have different shapes and dimensions with the corresponding different sized and shaped footprint. The LED packages according to the present invention can have an approximately square footprint, but it is understood that the packages can have footprints of different shapes. The LED packages can have sides measuring in the range of 3 to 30 mm, and a thickness in the range of 0.5 to 5 mm. In some embodiments, the LED packages can have a footprint of approximately 5.0 by 5.0 mm and can have a thickness of approximately 1.1 mm.

Different embodiments of LED packages can also have reflective cups with a depth ranging from 0.2 mm to 0.9 mm. In some embodiments, a cup depth can be less than 0.2 mm to provide the desired emission pattern, while in other embodiments a cavity depth of greater than 0.9 mm but less than the overall height of the emitter package. It is understood that generally the deeper the cavity is the narrower the resulting emission patter, and the shallower the reflective cup, the greater the width of the emission pattern. Accordingly, the depth of the reflective will be at least dependent on the desired emission angle of the LED package.

The LED package 50 also comprises a notch in one corner that serves as polarity indicator 53. This serves as an indicator for proper orientation when mounting the package for use, and is particularly useful for automated pick and place machines. It is understood that different LED packages can have polarity indicators in different locations that can have different shapes and sizes.

The LED package 50 further comprises a lead frame 56 for applying an electrical signal to the package that is conducted to the LEDs. As described below, the lead frame can also comprise features that improve mounting reliability for the LED packages and provide an additional thermal path for dissipating heat from the LEDs. The lead frame can also comprise physical features such as holes, cut-outs, etc. to increase the stability and reliability of the package. Some of these features are described in U.S. patent application Ser. No. 13/192,293 to Chan, at al., entitled Water Resistant Surface Mount Device Package, now U.S. Pat. No. 9,831,393, the entirety of which in incorporated herein by reference.

The lead frame 56 can be fabricated by many different known methods such as stamping, injection molding, cutting, etching, bending or through other known methods and/or combinations of methods to achieve the desired configurations. For example, the conductive parts can be partially metal stamped (e.g., stamped simultaneously from a single sheet of relevant material), appropriately bent, and fully separated or fully separated following the formation of some or all of the housing. The lead frame 56 can be made from an electrically conductive metal or metal alloy, such as copper, a copper alloy, and/or other suitable low resistivity, corrosion resistant materials or combinations of materials. As noted, the thermal conductivity of the leads can assist, to some extent, in conducting heat away from the LEDs. The housing 52 can be formed and/or assembled through any one of a variety of known methods as is known in the art. For example, the housing 52 can be formed or molded around the lead frame 56 by injection molding.

The reflective cup 54 can be at least partially filled with an encapsulant (not shown) that can protect and stabilize the lead frame 56 and LED described below. In some embodiments, the encapsulant can completely cover the emitters and the portions of the lead frame 56 exposed in the reflective cup 54. The encapsulant can be selected to have predetermined optical properties to enhance the projection of light from the LEDs, and in some embodiments, is substantially transparent to the light emitted by the package's LEDs. In some embodiments, the encapsulant can fill the reflective cup 54 to its top level and can be substantially flat along its top surface. In some embodiments the top surface can have some curve to it as the result of a meniscus formed by the between the encapsulant and the reflective cup during fabrication. In other embodiments, the encapsulant can be shaped (such as into a hemisphere or bullet shape), or can be fully or partially concave in the reflective cup 54. The encapsulant can be formed from a silicone, resin, an epoxy, a thermoplastic polycondensate, glass, and/or other suitable materials or combinations of materials. In some embodiments, materials may be added to the encapsulant, or the encapsulant may be textured, to enhance the emission, absorption, dispersion or mix the light emitted by the LEDs. For example, in some embodiments the encapsulant can include scattering particles to mix the light.

Portions of the lead frame 56 are accessible through the reflective cup 54 and the lead frame 56 can comprise die attach pads as locations for mounting LED chips to the lead frame 56. The LED package 50 can comprise a plurality of LEDs that can be individually controlled so that the package emits the desired combination of light from LEDs. In the embodiment shown, red, green and blue LEDs 58, 60 and 62 can be mounted to the lead frame 56 in the reflective cup 54 at die attach pads. Each of the LEDs 58, 60, 62 is mounted to a respective one of the leads in the lead frame. Each of the LEDs 58, 60, 62 operates from a respective pair of leads from the lead frame 56 for applying and electrical signal to one of the LEDs. Wire bonds 64 can also be included for applying an electrical signal to the LEDs 58, 60, 62 from the lead frame 56. The red LED 56 comprises a vertical geometry and requires one wire bond 64 to attach from the lead frame 52 to the top of the red LED 56. The green and blue LEDs 56 and 60 comprise a lateral geometry and require two wire bonds to conduct the necessary electrical signals from the lead frame 52 to the top of each of the LEDs 56, 60. As described above, the emission of the RGB LEDs 58, 60, 62 can be individually controlled to emit different color combinations of red, green and blue light, including a white light combination.

The LED package 50 further comprises a white solid state emitter having an improved or higher CRI compared to the light emission generated by the narrowband LED combination. In the embodiment shown, the white emitter comprises a white emitting LED with phosphor 66 mounted to the lead frame 56 and having a pair leads from the lead frame 56 for applying an electrical signal to the LED 66. The LED with phosphor 66 can comprises a blue LED coated with a phosphor, such as those currently known in the art. As discussed above, the LED with phosphor can comprise different LEDs emitting different wavelengths of light and coated with different lumiphoric materials such as phosphors or mixtures of phosphors including but not limited to yellow, green, red, orange or cyan. In the embodiment shown, the LED with phosphor 66 comprises a vertical geometry and only requires one wire bond 64 for applying an electrical signal from the lead frame to the top surface of the LED 66.

By providing each of the LEDs 56, 58, 60, 66 with its respective pair of leads, the emission and intensity of each of the LEDs can be individually controlled. This allows for the LED package to emit different color combinations from the LEDs as described above. In those instances where white light is desired with an improved CRI, an electrical signal can be applied to the white emitting LED 66 through its lead pair to emit white light. It is also understood that the LED with phosphor and narrowband LEDs can be controlled to emit light together in different instances, such as when it is desired to boost emission brightness, increase emission vividness, change the color temperature, etc.

Figure 11:
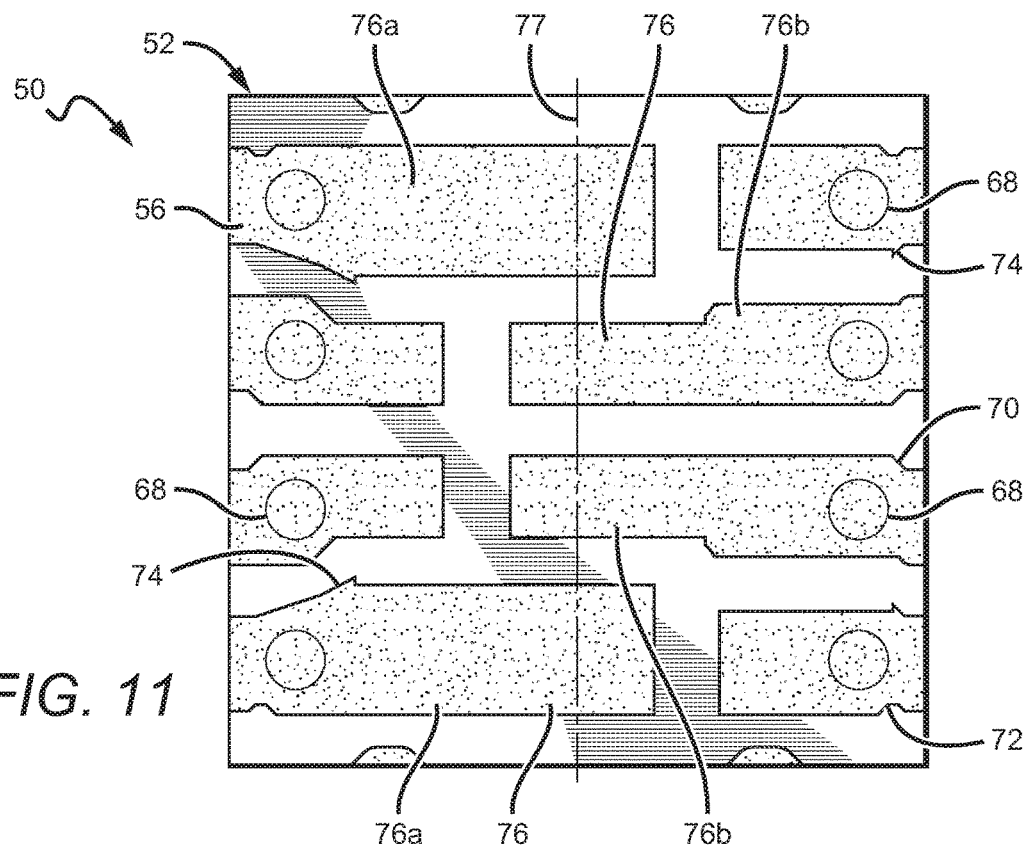
FIG. 11 is a bottom plan view of an LED package according to one embodiment of the present invention.

As mentioned above, the LED packages 50 can comprise a lead frame 56 having features that provide improved adhesion between the housing 52 and lead frame 56 during the operational heat cycles. The housing material and the lead frame material can expand and contract at different rates during heating and cooling. This can present a danger of the lead frame separating from the housing 52 and failure of the package 50. In the LED package 50, each of the leads in the lead frame 56 are visible in the reflective cup 54. Each lead also passes through the reflective cup 54, wraps around the side of the housing 52, and runs along the bottom surface of the housing 52. As best shown in FIG. 11, each of the leads has a lead frame hole 68 that allows for the housing material pass through when the housing 52 is molded to the lead frame 56 during fabrication. This helps anchor the lead frame 56 to the housing 52 during heat cycles. Each of the leads can also have additional anchoring features such as angles 70, cuts 72 and projections 74. The housing material can also be formed around these features to further assist in anchoring the lead frame to the housing during heat cycles. It is understood that the lead frames in LED packages according to the present invention can have many different types and numbers of anchoring features beyond those described above.

Conventional LED packages are provided with a lead frame having only relatively small portion running along the bottom surface with each of leads extending the same distance along the bottom surface. This can make electrical contact more difficult and can reduce the ability of the lead frame to dissipate heat. In the LED packages according to the present invention, some of the leads in the lead frame 56 extensions 76 extend a longer distance along the bottom surface of the LED package and cover a large portion of the LED package's bottom surface. This allows for some of the leads to overlap others of the leads to provide for greater lead coverage of the bottom surface. In most LED packages embodiments, the lead frame 56 comprises leads from opposing sides that run towards each other. The extensions 76 allow for opposing leads to overlap such as leads 76a overlapping with opposing leads 76b. In some embodiments, some of the lead extensions can extend past the centerline of the bottom surface and in the embodiment shown, leads 76a and 76b extend past the centerline 77. It is understood that this is only one pattern of how the extensions can be arranged and might overlap.

The extensions in the lead frame 56 allow for easier and more reliable electrical connection when mounting the LED packages for use. During operation, heat from the LEDs also radiates into the leads of the lead frame 56. The extended leads in the lead frame 56 also provide for a larger surface area to dissipate heat from the LEDs 58, 60, 62, 66 during LED package operation. The lead frames according to the present invention can have lead frame extensions that allow for different percentage of coverage of the housing's bottom surface. In some embodiments, the lead frames cover more than 50% of the LED package's bottom surface, with other embodiments covering approximately 50%, 60%, 70% or 80% of the bottom surface. In still other embodiments the lead frame can cover less than 50% of the bottom surface with some embodiments covering approximately 40%, 30% or 20% of the bottom surface.

The LEDs 58, 60, 62, 66 are linearly arranged adjacent to one another, but it is understood that the LEDs can be arranged in many different patterns. By utilizing an LED with phosphor 66 comprising a coated blue LED, a phosphor does not need to be included in the encapsulant as required in conventional LED packages. As a result, the reflective cup 54 does not need to be divided into separate compartments to segregate the phosphor containing encapsulant from the remaining encapsulant. The LED packages according to the present invention can provide a simplified reflective cup not having a dam or partition. This provides a number of advantages as mentioned above, including easier and cheaper manufacturing and also allowing for the LED WITH PHOSPHOR 66 to be in closer proximity to the RGB LEDs 58, 60, 62 to allow for smaller, more compact LED package.

Figure 12:
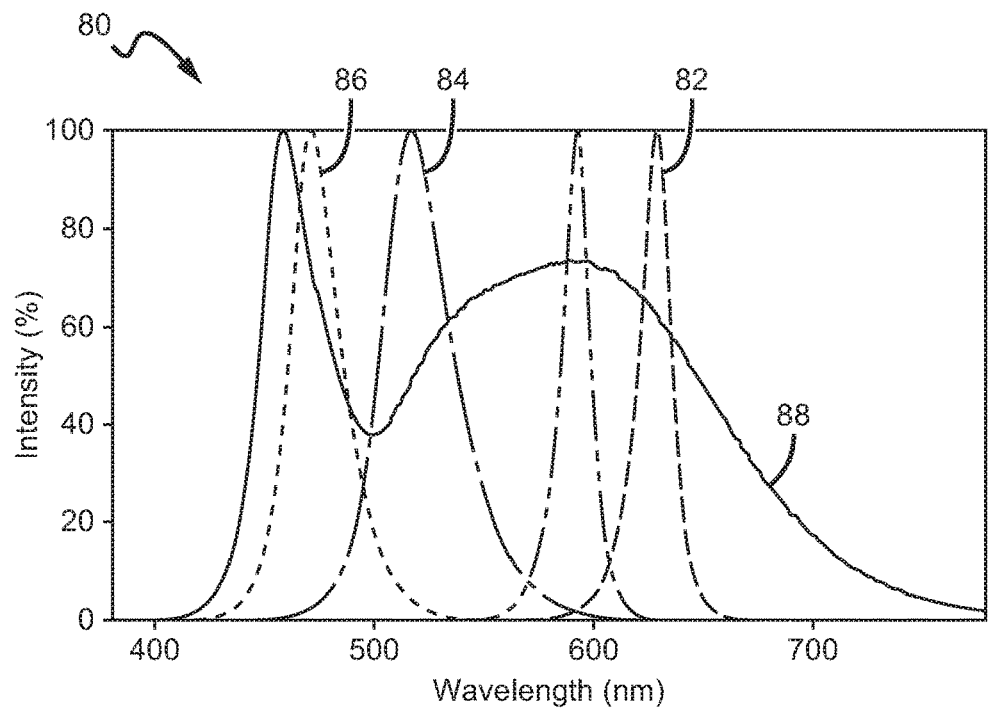
FIG. 12 is a graph comparing white light emission patterns from two different sources.

As mentioned above, the LED with phosphor 66 provides an emission that can have a higher CRI compared to white light emitted from narrowband LEDS. This is primarily due to the peaks in emission provided by the narrowband LEDs compared to typical LED with phosphors. FIG. 12 is a graph 80 comparing the emission provided by red, green and blue LEDs 82, 84, 86 with narrow peak emissions that can combine to produce a white light emission with relatively poor CRI. By contrast, the emission spectrum 88 provided by a LED with phosphor can have a broader emission pattern, primarily from the phosphor coating. This broader emission pattern provides for improved CRI.

Figure 13:
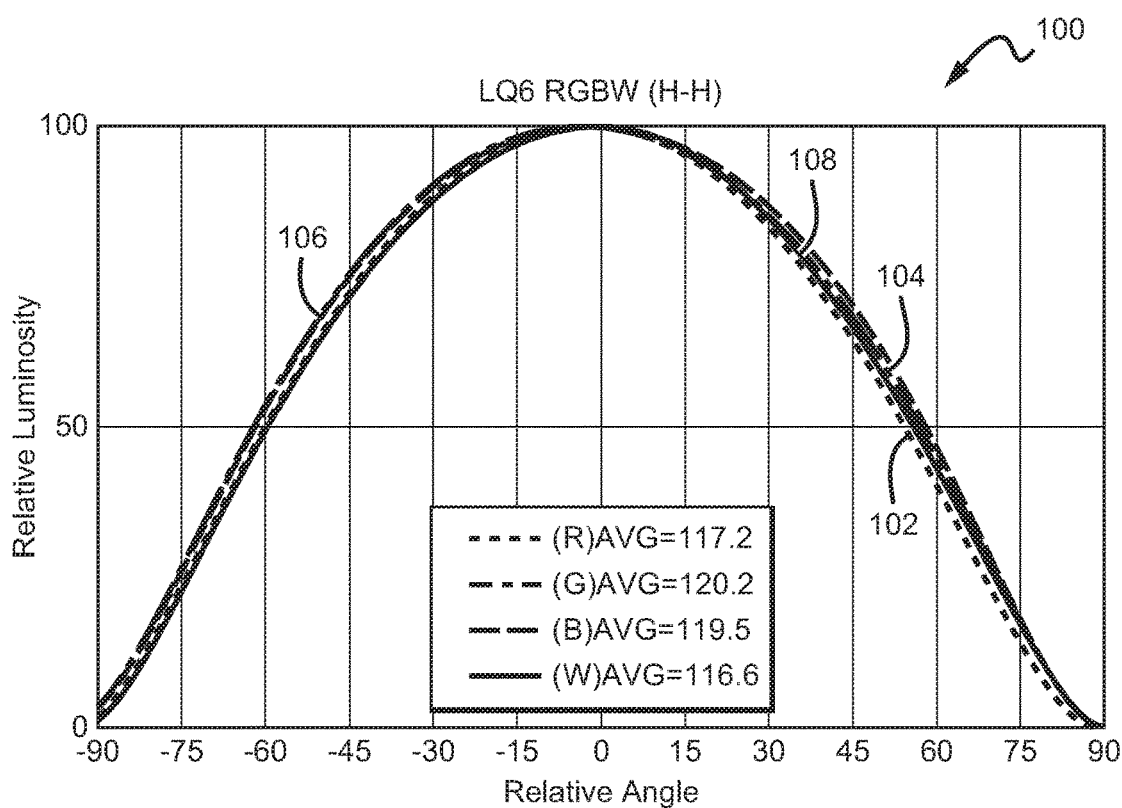
FIG. 13 is a graph showing the horizontal far field emission pattern for one embodiment of an LED package according to the present invention.
Figure 14:
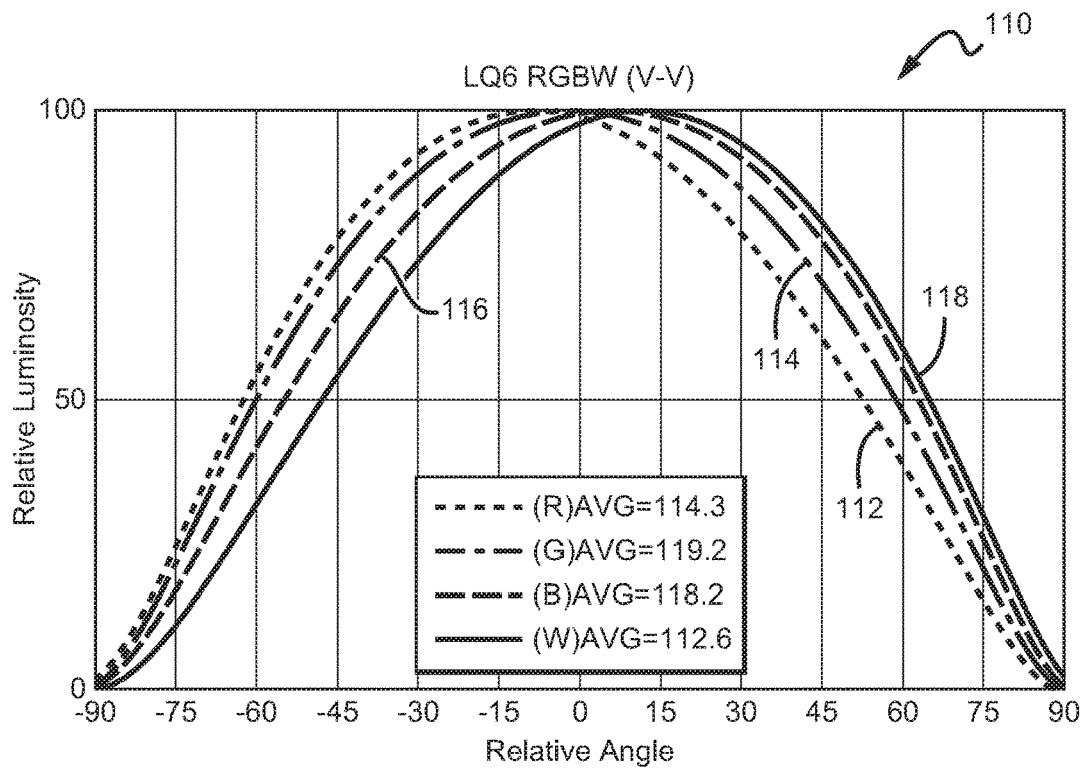
FIG. 14 is a graph showing the horizontal far field emission pattern for one embodiment of an LED package according to the present invention.

The LED packages according to the present invention can provide for improved emission profiles, particularly for far field emission patterns. FIGS. 13 and 14 show the far field emission patterns for one embodiment of an LED package according to the present invention. FIG. 13 shows the far field emission pattern 100 along the LED package's horizontal H-H axis and breaks out the red LED emission 102, green LED emission 104, blue LED emission 106 and BSY white LED emission 108. The pattern shows the near uniform emission from the LEDs in the LED package, making the individual emission patterns difficult to distinguish. FIG. 14 shows the far field emission pattern 110 along the LED package's vertical V-V axis and also breaks out the red LED emission 112, green LED emission 114, blue LED emission 116 and BSY white LED emission 118. The LED emission patterns in the V-V graph 110 do not overlap as closely as LED emission patterns the H-H graph 100, but still show good emission uniformity.

Figure 15:
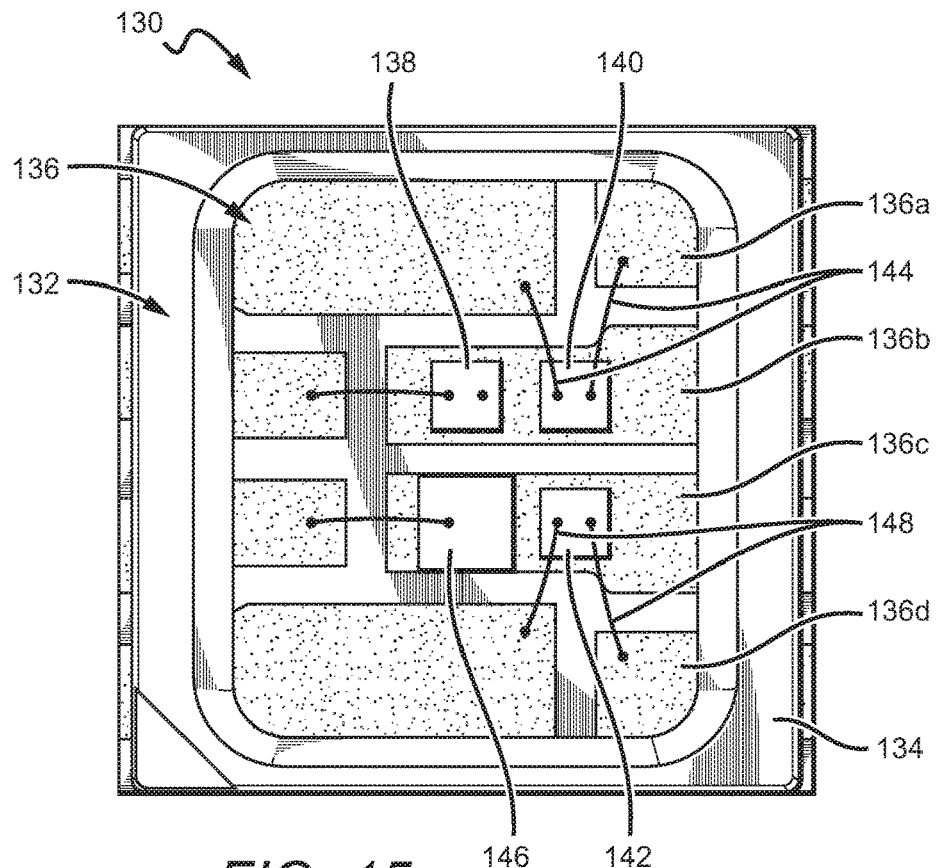
FIG. 15 is a top plan view of another embodiment of an LED package according to the present invention.

FIG. 15 shows another embodiment of an LED package 130 according to the present invention having a different shaped arrangement of LEDs. The LED package 130 is similar to the LED package described above and comprising a housing 132, reflective cup 134 and lead frame 136 similar to those described above. In the embodiment shown, the lead frame comprises lead frame pairs first, second, third and fourth lead frame pairs 136a, 136b, 136c and 136d. The LED package 130 also comprises red, green, blue LEDs 138, 140, 142 and an LED with phosphor 146 that are similar to those described above and that are mounted to the lead frame 134. The LED package 130 can also comprise an encapsulant as described above. In this embodiment the LEDs 138, 140, 142, 146 are not linearly arranged but are arranged in a group around the center of the reflective cup 134.

The red LED 138 is mounted on second lead pair 136b and the white LED with phosphor 146 is mounted on the third lead pair 136c, with an electrical signal applied through lead frame pairs 136b and 136c passing to its respective one of the LEDs 138, 146. The green LED 140 is also mounted on lead pair 136b adjacent the red LED 138, and the blue LED 142 is mounted on lead pair 136c adjacent the white LED with phosphor 146. The horizontal geometry of the green and blue emitting LEDs 140, 142 allows them to be mounted on the lead pairs 136b, 136c without making electrical contact. First wire bonds 144 provide electrical connection to the green LED 140 from the lead pair 136a and electrical connection is made to the blue LED 142 from the lead pair 136d through second wire bonds 148. Accordingly, each of the LEDs 138, 140, 142, 146 is individually controllable to provide the desired package emission as described above. Grouping the LEDs near the center can provide the advantage of the LEDs more closely approximating a point source. This is only one example of the many different LED placement patterns according to the present invention.

Figure 16:
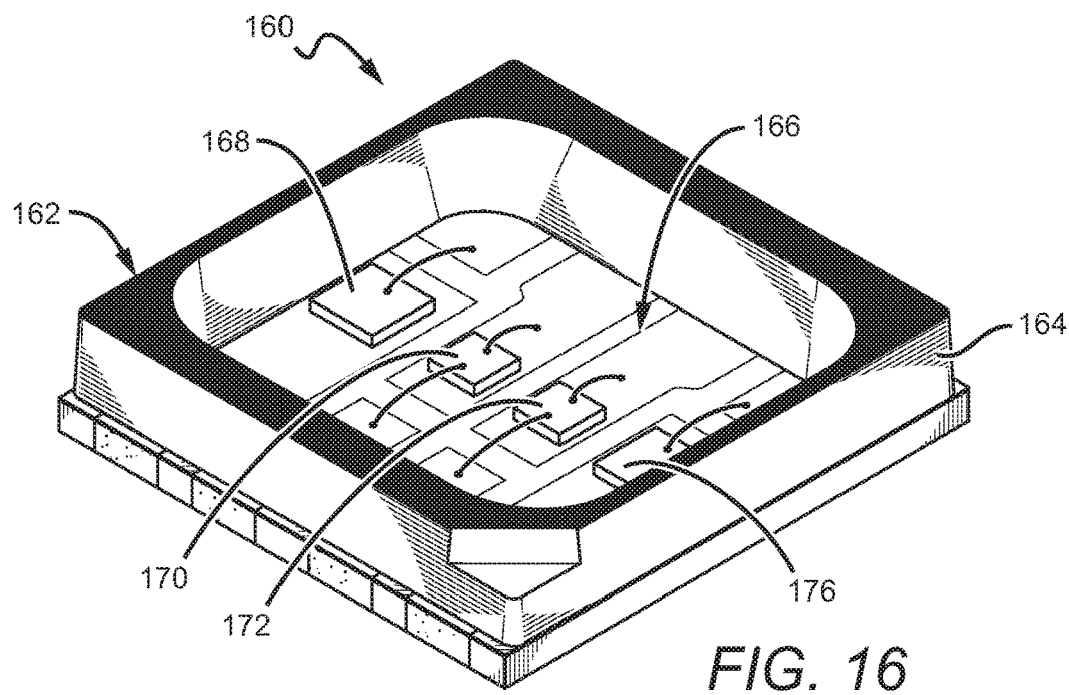
FIG. 16 is a perspective view of still another embodiment of an LED package according to the present invention.
Figure 17:
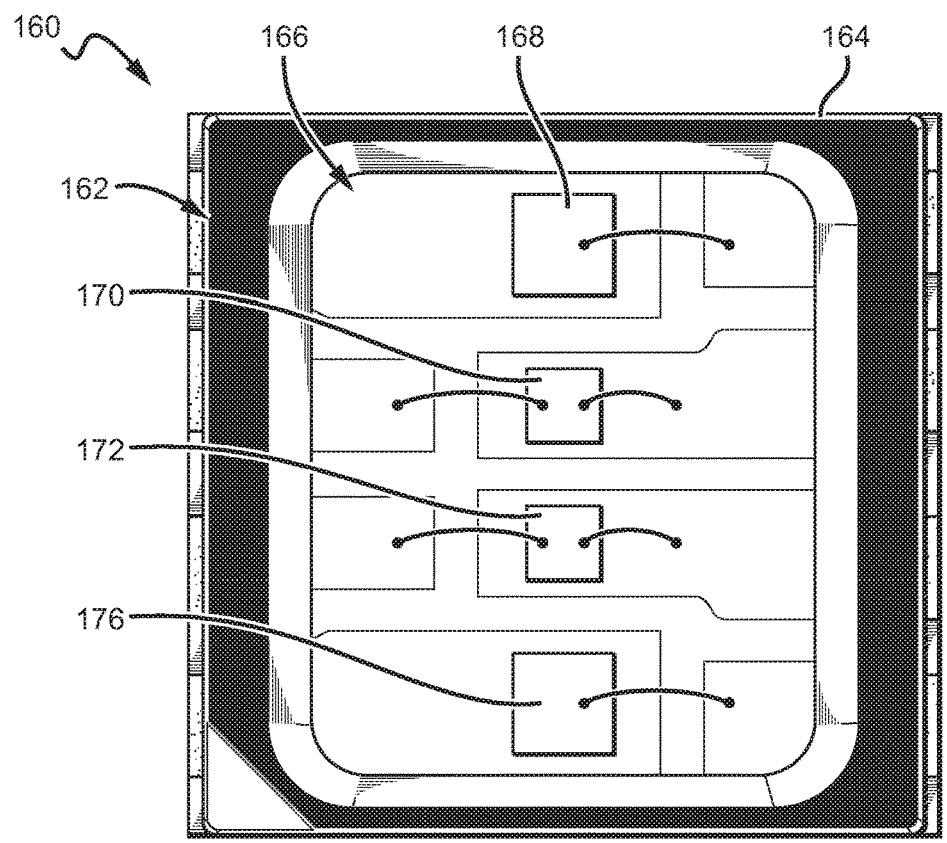
FIG. 17 is a top plan view of another embodiment of an LED package according to the present invention.

It is also understood that other embodiments of LED packages according to the present invention can have many different features beyond those described above. FIGS. 16 and 17 show another embodiment of an LED package 160 according to the present invention having a housing 162, reflective cup 164, lead frame 166 and LEDs 168, 170, 172, 176 similar to those described above. In this embodiment, the face of the reflective cup is black, which provides enhanced contrast between the LED package emission and housing. 162. This can provide advantages depending on the use of the LED package 160. For example, the black face can result in improved image resolution when a plurality of LED packages 160 are arranged in a display to generate an image. This is only one of the additional features that can be provided in LED packages according to the present invention.

Figure 18:
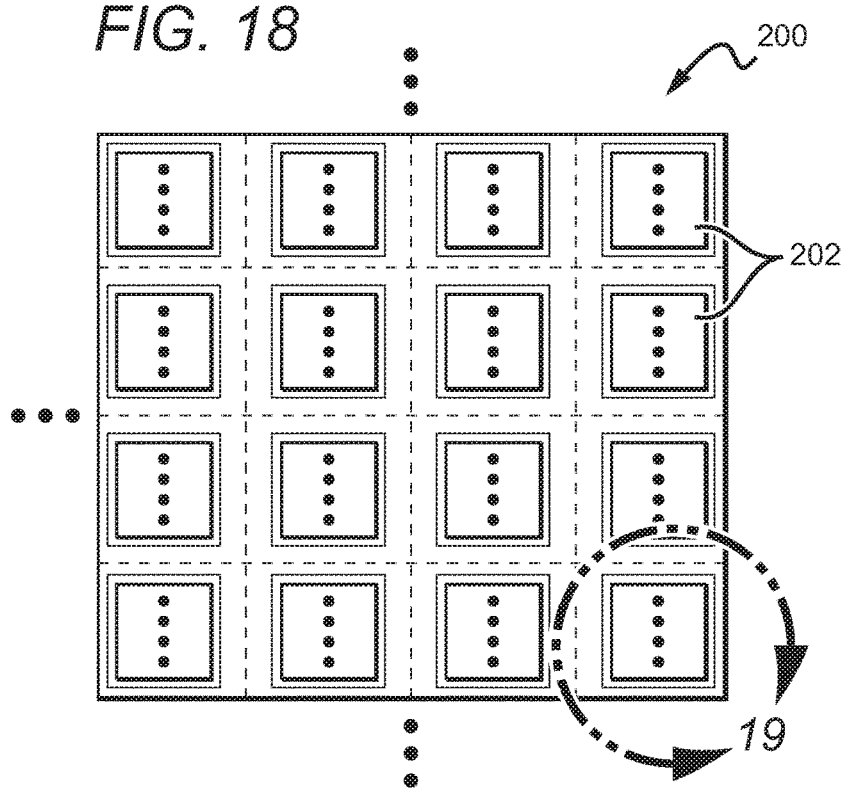
FIG. 18 is top plan view of one embodiment of an LED display according to the present invention.
Figure 19:
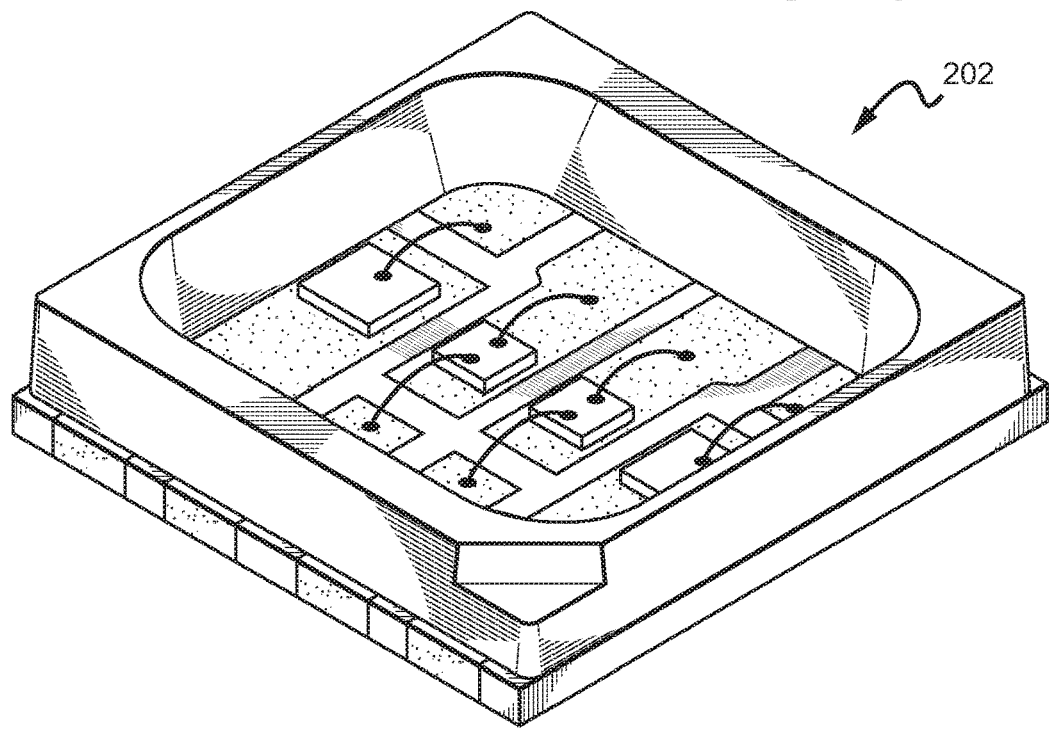
FIG. 19 is perspective view of one LED package according to the present invention that can be used in the LED display of FIG. 18.

FIG. 18 shows one embodiment of an LED display 200 according to the present invention that can use a plurality of LED packages 202 described herein mounted adjacent one another on a submount and individually controlled to generate an image. The display shows only 16 LED packages, but it understood that displays can utilize hundreds or thousands of LED packages, depending on the size of the display. FIG. 19 shows just one of the many different LED packages 202 that can be used in the display 200 that is similar to the LED package 50 described above and shown in FIGS. 5-11. It is understood that many different LED packages can be used according to the present invention.

Although the present invention has been described in detail with reference to certain configurations thereof, other versions are possible. Therefore, the spirit and scope of the invention should not be limited to the versions described above.

We claim:

1. A light emitting diode (LED) package, comprising:
 a housing having a single reflective cup;
 a lead frame integral to said housing, a portion of said lead frame exposed in said reflective cup, said lead frame comprising leads that run along a bottom surface of said housing from opposing sides of said housing such that certain ones of said leads that extend from a same side of said opposing sides and along said bottom surface have extensions that extend a longer distance along said bottom surface than others of said leads that extend from the same side, with at least some of said leads from opposing sides extending past a center line of the bottom surface to overlap one another on adjacent portions of the bottom surface; and
 a plurality of LEDs mounted to said lead frame in said reflective cup, with said lead frame arranged to allow for individual control of said LEDs.

2. The LED package of claim 1, wherein said LEDs comprises a plurality of narrowband LEDs and a LED with phosphor.

3. The LED package of claim 1, wherein said reflective cup is undivided.

4. The LED package of claim 2, wherein said narrowband LEDs comprise red, green and blue LEDs.

5. The LED package of claim 2, wherein said narrowband LEDs and said LED with phosphor are linearly arranged in said reflective cup.

6. The LED package of claim 2, wherein said narrowband LEDs and said LED with phosphor are arranged around a center point of said reflective cup.

7. The LED package of claim 2, wherein said narrowband LEDs and said LED with phosphor are arranged in a square.

8. The LED package of claim 1, wherein said lead frame covers more than 50 percent of said bottom surface.

9. The LED package of claim 1, wherein said lead frame comprises anchoring features.

10. The LED package of claim 9, wherein said anchoring features can comprise holes, angles, cuts or projections.

11. The LED package of claim 2, wherein said LED with phosphor has a higher color rendering index (CRI) than the combined light from said narrowband LEDs.

12. A light emitting diode (LED) package, comprising:
 a housing having an undivided reflective cup, with a plurality of narrowband LEDs and a LED with phosphor mounted in said reflective cup; and
 a lead frame integral to said housing and arranged to allow for individual control of each of said LEDs, wherein said lead frame extends on and covers more than 50 percent of a bottom surface of said housing, and said lead frame comprises leads that run along the bottom surface of said housing from opposing sides of said housing such that certain ones of said leads that extend from a same side of said opposing sides and along said bottom surface have extensions that extend a longer distance along said bottom surface than others of said leads that extend from the same side, with at least some of said leads from opposing sides extending past a center line of the bottom surface to overlap one another on adjacent portions of the bottom surface.

13. The LED package of claim 12, wherein said lead frame covers more than 60 percent of said bottom surface.

14. The LED package of claim 12, wherein said lead frame covers more than 80 percent of said bottom surface.

15. The LED package of claim 12, wherein said lead frame comprises holes, angles, cuts or projections.

16. The LED package of claim 12, wherein said LED with phosphor has a higher color rendering index (CRI) than the combined light from said narrowband LEDs.

17. A light emitting diode (LED) package, comprising:
a housing having a single undivided reflective cup; and
a lead frame integral to said housing, a portion of said lead frame exposed in said reflective cup, a plurality of narrowband LEDs and a broadband LED with phosphor mounted to said lead frame in a line or in a square, said lead frame arranged to allow for individual control of said LEDs, said lead frame comprising leads that run along a bottom surface of said housing from opposing sides of said housing such that certain ones of said leads that extend from a same side of said opposing sides and along said bottom surface have extensions that extend a longer distance along said bottom surface than others of said leads that extend from the same side, with at least some of said leads from opposing sides extending past a center line of the bottom surface to overlap one another on adjacent portions of the bottom surface.

18. The LED package of claim 17, wherein said LED with phosphor has a higher color rendering index (CRI) than the combined light from said narrowband LEDs.

19. A light emitting diode (LED) display, comprising:
a plurality of LED packages mounted in relation to one another to generate a message, wherein at least some of said LED packages comprise a housing having a single undivided reflective cup and a lead frame integral to said housing, a portion of said lead frame exposed in said reflective cup, a plurality of narrowband LEDs and a broadband LED with phosphor mounted to said lead frame in a line or in a square, said lead frame arranged to allow for individual control of said LEDs, and said lead frame comprising leads that run along a bottom surface of said housing from opposing sides of said housing such that certain ones of said leads that extend from a same side of said opposing sides and along said bottom surface have extensions that extend a longer distance along said bottom surface than others of said leads that extend from the same side, with at least some of said leads from opposing sides extending past a center line of the bottom surface to overlap one another on adjacent portions of the bottom surface.

20. The LED package of claim 19, wherein said LED with phosphor has a higher color rendering index (CRI) than the combined light from said narrowband LEDs.

\* \* \* \* \*